United States Patent [19]
Fukuba

[11] Patent Number: 5,477,069
[45] Date of Patent: Dec. 19, 1995

[54] CHARGE TRANSFER DEVICE AND DRIVING METHOD FOR THE SAME

[75] Inventor: Nobuyuki Fukuba, Nara, Japan

[73] Assignee: Sharp Kabushiki Kaisha, Osaka, Japan

[21] Appl. No.: 307,181

[22] Filed: Sep. 16, 1994

[30] Foreign Application Priority Data

Sep. 16, 1993 [JP] Japan .................... 5-230584

[51] Int. Cl.$^6$ .................................. H01L 29/78
[52] U.S. Cl. .................... 257/241; 257/231; 257/236; 257/248; 257/250
[58] Field of Search .................... 257/231, 232, 257/233, 236, 240, 241, 248, 250

[56] References Cited

U.S. PATENT DOCUMENTS 5,164,807  12/1992  Thenwissen ............... 257/241
5,189,498  2/1993  Sakakibara ............... 257/241

FOREIGN PATENT DOCUMENTS 4-213282  8/1992  Japan .

*Primary Examiner*—Ngân V. Ngô
*Attorney, Agent, or Firm*—David G. Conlin; Brian L. Michaelis

[57] ABSTRACT

The charge transfer device according to the present invention includes: a plurality of vertical transfer channels; a first transfer gate electrode placed at the ends of the plurality of vertical transfer channels for receiving signal charge from the plurality of vertical transfer channels and for outputting the signal charge; a plurality of horizontal transfer channels having a plurality of layers of gate electrodes for transferring the signal charge from the first transfer gate electrode in a horizontal direction; at least one second transfer gate electrode disposed between the plurality of horizontal transfer channels for transferring the signal charge from one of the horizontal transfer channels to another horizontal transfer channel; a conductive portion for supplying a transfer control signal to the plurality of horizontal transfer channels; at least one output section for converting the signal charge transferred from the plurality of horizontal transfer channels into a voltage signal and for outputting the thus obtained voltage signal; and a contact portion provided on at least one of the first and second transfer gate electrodes, through which at least one of the plurality of layers of the gate electrodes constituting the horizontal transfer channels and the conductive portion are in contact with each other.

7 Claims, 11 Drawing Sheets

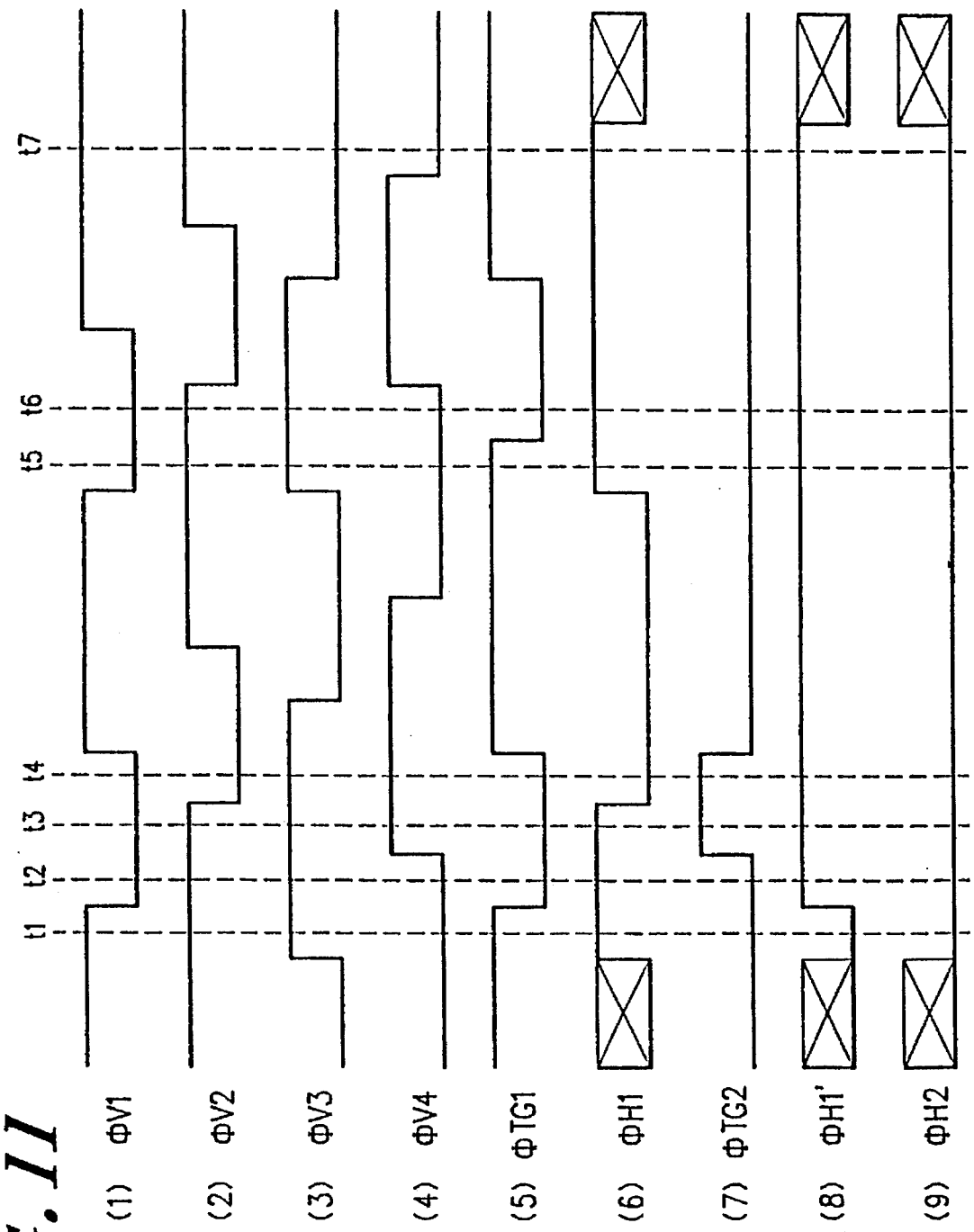

5,477,069

CHARGE TRANSFER DEVICE AND DRIVING METHOD FOR THE SAME

BACKGROUND OF THE INVENTION

1. Field of the Invention:

The present invention relates to a charge-coupled device suitable for use in such apparatuses as an image sensor and a delay element, more particularly, to a charge transfer device having such a structure that no signal charge is left when the signal charge is transferred from vertical transfer channels to a plurality of horizontal transfer channels and a method for driving the same.

2. Description of the Related Art:

As a typical charge transfer device using a charge-coupled device (hereinafter, referred to as a "CCD"), an image sensor is widely known. In recent years, the image sensor tends to be provided with a large number of picture elements so as to increase resolution. In addition, a chip for the image sensor is becoming more and more reduced in its size so as to provide high-density for the image sensor. For these purposes, it is effective to dispose horizontal transfer channels in a plurality of rows for preventing the transfer frequency and the amount of dissipated power from increasing as the number of picture elements increases. It is also effective to dispose the horizontal transfer channels in a plurality of rows so as to reduce the pitch of transfer electrodes in order to provided a CCD with high-density.

Hereinafter, a conventional example will be described, taking a solid-state image pickup device including horizontal transfer channels, which consists of a charge transfer device (hereinafter, referred to as a "CTD") with CCDs in two rows as an example.

FIG. 1 illustrates a plan view showing a boundary area between a plurality of vertical transfer channels 2 and horizontal transfer channels 3 and 4 in two rows in the CTD 1 according to a conventional example. The CTD 1 of the conventional example includes the vertical transfer channels 2 in a plurality of columns. Each of the vertical transfer channels 2 is constituted by a four-phase CCD using a final stage driving signal $\Phi V4$. The CTD 1 has a first transfer gate 5 driven by a driving signal $\Phi TG1$ between each vertical transfer channel 2 and the first horizontal transfer channel 3, and a second transfer gate 6 driven by a driving signal $\Phi TG2$ between the horizontal transfer channels 3 and 4 in two rows.

FIG. 2 shows a cross-sectional view taken along line X9—X9 in FIG. 1. FIG. 3 shows a cross-sectional view taken along line X10—X10 in FIG. 1. In the CTD 1, an N$^-$ layer 8 is formed on a P-type substrate (hereinafter, referred to simply as a "substrate") 7, and then an insulating layer 9 made of, for example, silicon oxide is formed on the N$^-$ layer 8. The following structure is formed on the insulating layer 9 by thin film technology. A P$^-$ region is formed as a barrier layer 19a in the N$^-$ layer 8 between the first transfer gate 5 and the horizontal transfer channel 3. A P$^-$ region is formed as a barrier layer 19b in the N$^-$ layer 8 between an electrode 14 and an electrode 11 of the driving signal $\Phi V4$ constituting the transfer gate 5. The configurations similar to that of the barrier layers 19a and 19b are formed as channel stops 20 between the vertical transfer channels 2. The CTD 1 includes electrodes 10 and 11 in a plurality of rows, respectively, extending in a horizontal direction of FIG. 1, i.e., a row direction formed on the insulating layer 9. The electrodes 10 and 11 are formed so that the ends of the electrodes 10 and 11 in a width direction overlap each other.

An insulating layer 12 is formed between the electrodes 10 and 11. An electrode 13 is formed so as to overlap the end of the width direction of the electrode 11 on the final stage of the vertical transfer channel 2. The electrode 13 constitutes the first transfer gate 5 together with the electrode 14. The electrodes 13 and 14 extend in the row direction. The other end of the electrode 13 overlaps part of the electrode 14. The electrodes 13 and 14 are insulated from each other by the insulating layer 12. The driving signal $\Phi TG1$ is supplied to the electrodes 13 and 14.

A plurality of electrodes 15 and 16 are formed in the vicinity of the end on the side opposite to the electrode 13 of the electrode 14 extending in the row direction. The ends of the plurality of electrodes 15 and 16 of a vertical direction overlap the vicinity of an end on the side opposite to the electrode 13 of the electrode 14. The horizontal transfer channel 3 includes the electrodes 15 and 16 extending in a column direction perpendicular to the row direction. Driving signals $\Phi H1$ and $\Phi H2$ are supplied to the plurality of electrodes 15 and 16 whose ends in the width direction overlap each other. The electrode 15 is insulated from the electrode 14 by the insulating layer 12, and further from the electrode 16 by an insulating layer 17. The electrodes 15 and 16, as shown in FIG. 1, are bent so as to be inclined with respect to the width direction in the region where the second transfer gate 6 is formed. Passing through the region where the second transfer gate 6 is formed, the electrodes 15 and 16 extend straight in the column direction again.

The transfer gate 6 extends in the row direction and includes an electrode 18 having a length in the column direction, i.e., a gate length L1. The same configurations as those of the channel stops 220 are disposed as channel stops 21 in the transfer gate 6. With this structure, transfer channels 22 extending in a direction indicated with an arrow A1 are formed between the channel stops 21 in the transfer gate 6. The driving signal $\Phi TG2$ is supplied to the electrode 18. Each of the plurality of electrodes 15 formed on the electrode 18, as shown in FIG. 3, extends so as to cross the electrode 18 interposing the insulating layer 12 therebetween. On the electrode 18, the plurality of electrodes 16 adjacent to each other are disposed at intervals L2 (FIG. 2) in the direction of the arrow A1, and the plurality of electrodes 15 adjacent to each other are disposed at intervals L3 (FIG. 2) in the direction of the arrow A1.

The substrate 7, on which the above configuration is formed, is covered with a transparent insulating layer 23, and then a light shielding film 24 is formed on the transparent insulating layer 23, as shown in FIGS. 2 and 3. Sequentially, a transparent insulating layer 25 is formed on the light shielding film 24, and then a light shielding layer 26 is formed on the transparent insulating layer 25. The light shielding layers 24 and 26 are made of, for example, aluminum. As shown in FIG. 2, a field insulating layer 30 is formed on the substrate 7 at the ends of the sides opposite to the transfer gate 6 of the plurality of electrodes 15 and 16. A metal wiring 28 made of aluminum and the like is connected through a contact hole 27 formed through the transparent insulating layers 23 and 25 on the field insulating layer 30. The driving signals $\Phi H1$ and $\Phi H2$ are supplied to the electrodes 15 and 16 via the metal wiring 28.

Voltage potentials in the vertical transfer channels 2, the transfer gate 5, the horizontal transfer channel 3, the transfer gate 6, and the horizontal transfer channel 4 in the conventional CTD 1 are shown in FIG. 4.

In the CTD 1 with the above structure, signal charge horizontally transferred in the second horizontal transfer channel 4 alone is transferred from the first horizontal transfer channel 3 to the second horizontal transfer channel 4, while keeping the signal charge to be horizontally transferred in the first horizontal transfer channel 3 so as not to be horizontally transferred. In order to realize this operation, the signal charge is temporarily stored under the transfer gate 6 provided between the first horizontal transfer channel 3 and the second horizontal transfer channel 4. For this purpose, the transfer gate 6 is required to ensure sufficient storage capacity. Therefore, it is necessary to set the gate length L1 at a large value. As described below, the large gate length L1 causes the insufficient insurance of transfer efficiency when the charge is transferred from the transfer gate 6 to the second horizontal transfer channel 4.

As a result, during the transfer of charge from the transfer gate 6 to the second horizontal channel 4, part of the signal charge is left in the transfer gate 6. The left signal charge flows at random into the first and second horizontal transfer channels 3 and 4 when the signal charge is transferred at high speed in the row direction by the succeeding two-phase first and second horizontal transfer channels 3 and 4. This will cause vertically striped pattern noise on an image screen.

In such a conventional technique, the electrodes 15 and 16 of the horizontal transfer channels 3 and 4 are electrically connected to the metal wiring 28 on the side opposite to the transfer gate 6 with respect to the second horizontal transfer channel 4, as shown in FIG. 2. Moreover, each of the plurality of electrodes 15 and 16 is required to be an independent electrode electrically insulated from each other, to which each of the driving signals $\Phi H1$ and $\Phi H2$ is independently supplied. In addition, the electrodes 15 and 16 should be electrically separated from each other on the transfer gate 6. As the widths of the electrodes 15 and 16 are reduced and therefore an arrangement pitch is reduced in the horizontal transfer channels 3 and 4 to provide high density for the CCD, it becomes more difficult to satisfy the requirements described above.

If the attempt to meet the above requirements is made by using the conventional technique, the transfer channel 22 should be bent in the transfer gate 6 and the gate length L1 of the electrode 18 of the transfer gate 6 should be set at a large value, as shown in FIG. 1. Even if such a measure is taken, however, the above problems are not perfectly solved.

As a second conventional technique used to solve the problems of the above conventional technique, Japanese Laid-Open Patent Publication No. 4-213282 discloses a device in which the horizontal transfer signal lines are constituted independently from one another in first and second horizontal transfer channels so as not to store charge in transfer gates between a plurality of horizontal transfer channels.

In such a device, however, the metal wiring 28 is electrically connected to the gate electrodes 15 and 16 through a contact portion 29 on the horizontal transfer channels, i.e., an active region. Thus, an alloy reaction, which changes the channel potential, occurs in the contact portion 29. As a result, deterioration of transfer is caused.

In order to avoid the above disadvantages of the second conventional technique, the structure, in which a barrier layer made of polysilicon and the like is provided so as to prevent the metal wiring and the gate electrodes from being directly electrically connected to each other directly above the transfer channel, has been proposed. In this structure, however, the transfer channel is electrically connected to the barrier layer on the gate electrode. Therefore, in terms of design rule, the pitch of the plurality of electrodes of the horizontal transfer channels is required to be 10 μm or more. Thus, such a pitch of electrodes is inadequate to provide a large number of picture elements and high-density for the CCD. Thus, the structure is disadvantageous in that the transfer channel 22 of the transfer gate 6 cannot be provided on prolongations of all the vertical transfer channels 2 in the CTD having the pitch of 10 μm or less along the horizontal direction of the plurality of electrodes 15 and 16 provided for the horizontal transfer channels 3 and 4 shown in FIGS. 1 to 3.

SUMMARY OF THE INVENTION

The charge transfer device of the present invention includes: a plurality of vertical transfer channels; a first transfer gate electrode placed at ends of the plurality of vertical transfer channels for receiving signal charge from the plurality of vertical transfer channels and for outputting the signal charge; a plurality of horizontal transfer channels having a plurality of layers of gate electrodes for transferring the signal charge from the first transfer gate electrode in a horizontal direction; at least one second transfer gate electrode disposed between the plurality of horizontal transfer channels for transferring the signal charge from one of the horizontal transfer channels to another horizontal transfer channel; a conductive portion for supplying a transfer control signal to the plurality of horizontal transfer channels; at least one output section for converting the signal charge transferred from the plurality of horizontal transfer channels into a voltage signal and for outputting the thus obtained voltage signal; and a contact portion provided on at least one of the first and second transfer gate electrodes, through which at least one of the plurality of layers of the gate electrodes in the horizontal transfer channels and the conductive portion are in contact with each other.

In one embodiment of the present invention, a light shielding layer is provided so as to prevent light from being incident on at least one of the vertical transfer channels and the horizontal transfer channels.

Alternatively, a charge transfer device includes: a plurality of vertical transfer channels; a transfer gate electrode placed at ends of the plurality of vertical transfer channels for receiving signal charge from the plurality of vertical transfer channels and for outputting the signal charge; a plurality of horizontal transfer channels including two-phase charge-coupled devices having a first signal line and a second signal line and a plurality of layers of gate electrodes for transferring the signal charge from the transfer gate electrode in a horizontal direction; and a conductive portion for supplying a transfer control signal to the horizontal transfer channels; wherein each of the gate electrodes, which is connected to one of the first and second signal lines adjacent to a transfer channel under the transfer gate electrode, is made independent for each transfer channel by electrically connecting the gate electrodes to the conductive portion on the transfer gate electrode, and wherein the residual gate electrodes connected to the other signal line are common to the plurality of horizontal transfer channels.

In one embodiment of the invention, the transfer channels under the transfer gate electrode are provided on prolongations of the vertical transfer channels so as to be perpendicular to the horizontal transfer channels.

In another embodiment of the invention, the transfer channel under the transfer gate electrode is provided on each prolongation of the vertical transfer channel.

In still another embodiment of the invention, a potential of one of the horizontal transfer channels far from the vertical transfer channels is set so as to be higher than that of another horizontal transfer channel close to the vertical transfer channels in a case where a potential applied to each independent transfer electrode is identical when a signal charge is transferred to the plurality of horizontal transfer channels via the transfer gate.

According to another aspect of the invention, a driving method for a charge transfer device includes: a plurality of vertical transfer channels; a transfer gate electrode placed at ends of the plurality of vertical transfer channels for receiving signal charge from the plurality of vertical transfer channels and for outputting the signal charge; a plurality of horizontal transfer channels including two-phase charge-coupled devices having a first signal line and a second signal line and a plurality of layers of gate electrodes for transferring the signal charge from the transfer gate electrode in a horizontal direction; and a conductive portion for supplying a transfer control signal to the horizontal transfer channels, wherein each of the gate electrodes which are connected to one of the first and second signal lines adjacent to a transfer channel under the transfer gate electrode is formed as an independent electrode for each transfer channel by electrically connecting the gate electrode to the conductive portion on the transfer gate electrode, and wherein the residual gate electrodes connected to the other signal line form a common electrode to the plurality of horizontal transfer channels, the driving method for the charge transfer device for applying a voltage to one signal line serving as the common electrode among the plurality of transfer channels so that a channel potential is kept to be low while charge is transferred from one horizontal transfer channel to another horizontal transfer channel through the transfer gate during a quiescent period of the horizontal transfer, wherein a clock is applied only to the other signal line which serves as the independent electrode for each of the plurality of horizontal transfer channels and a signal line of the transfer gate, thereby transferring a charge from one horizontal transfer channel to another horizontal transfer channel.

As described above, according to the present invention, gate electrodes and a metal wiring are electrically connected with each other on an activated region. Since a first layer serves as a barrier layer on a gate electrode of the first layer, changes in the channel potential due to an alloy reaction can be prevented. Moreover, since an electrical connecting portion is provided in the shape corresponding to the gate electrode of the first layer, it is not required to reconsider a design rule even when the horizontal pitch is reduced for providing high density for the CCD. In addition, since the length of the transfer gate is set at a sufficiently small value and a transfer channel under the transfer gate is provided along a direction in which the vertical transfer channel is extended, it is unnecessary to bend the transfer channel with respect to the direction in which the vertical transfer channels extend. Therefore, no signal charge is left when the signal charge is transferred from the vertical transfer channels to a plurality of horizontal transfer channels.

Thus, the invention described herein makes possible the advantages of (1) providing a charge transfer device with high-density having a simple configuration capable of preventing signal charge from being left during a transfer of signal charge from vertical transfer channels to a plurality of horizontal transfer channels, and (2) providing a driving method for the charge transfer device.

These and other advantages of the present invention will become apparent to those skilled in the art upon reading and understanding the following detailed description with reference to the accompanying figures.

BRIEF DESCRIPTION OF THE DRAWINGS

FIG. 11 is a timing diagram illustrating a driving timing of a CCD according to the present example.

DESCRIPTION OF THE PREFERRED EMBODIMENTS

Hereinafter, the present invention will be described by way of illustrative examples, with reference to the accompanying drawings, taking a solid-state image pickup device including horizontal transfer channels, which consists of a CTD with CCDs in two lows as an example.

First, a configuration of a CTD 31 of the present example will be described with reference to FIGS. 5 to 8.

Figure 1:
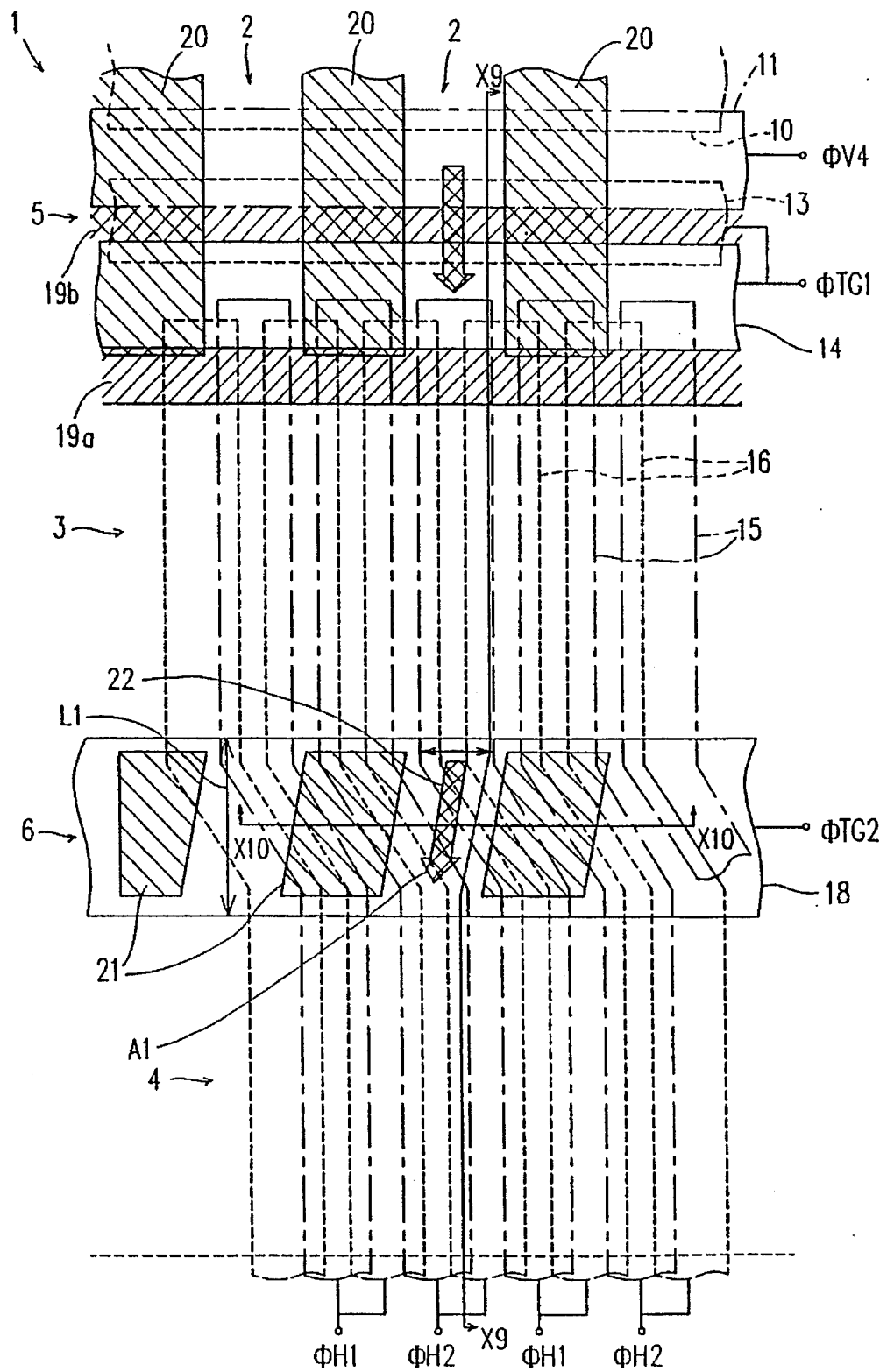
FIG. 1 is a plan view showing a boundary area between a plurality of vertical transfer channels and horizontal transfer channels in two rows in a CTD with CCDs according to a conventional example.
Figure 2:
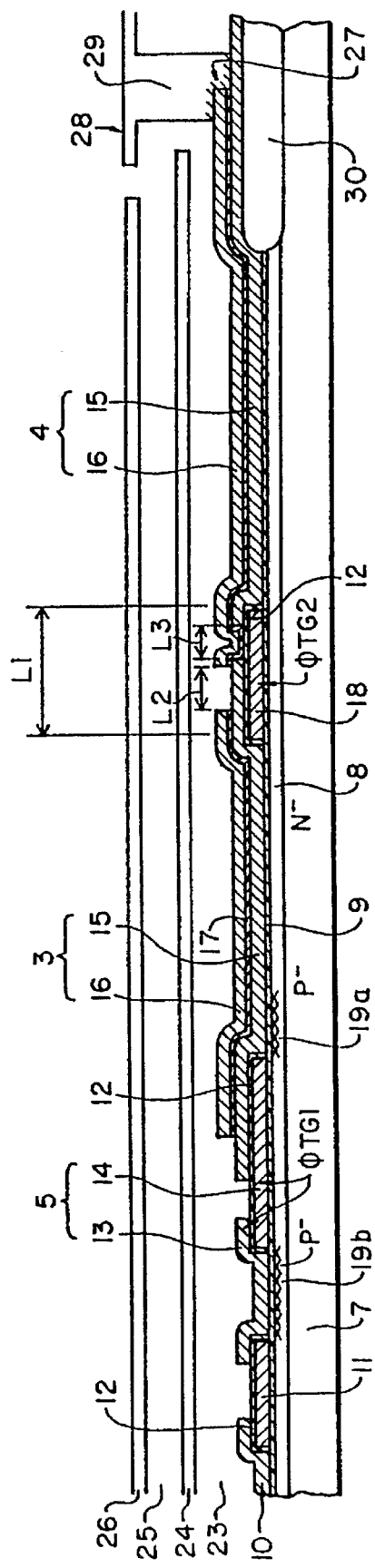
FIG. 2 is a cross-sectional view taken along section line X9—X9 in FIG. 1.
Figure 3:
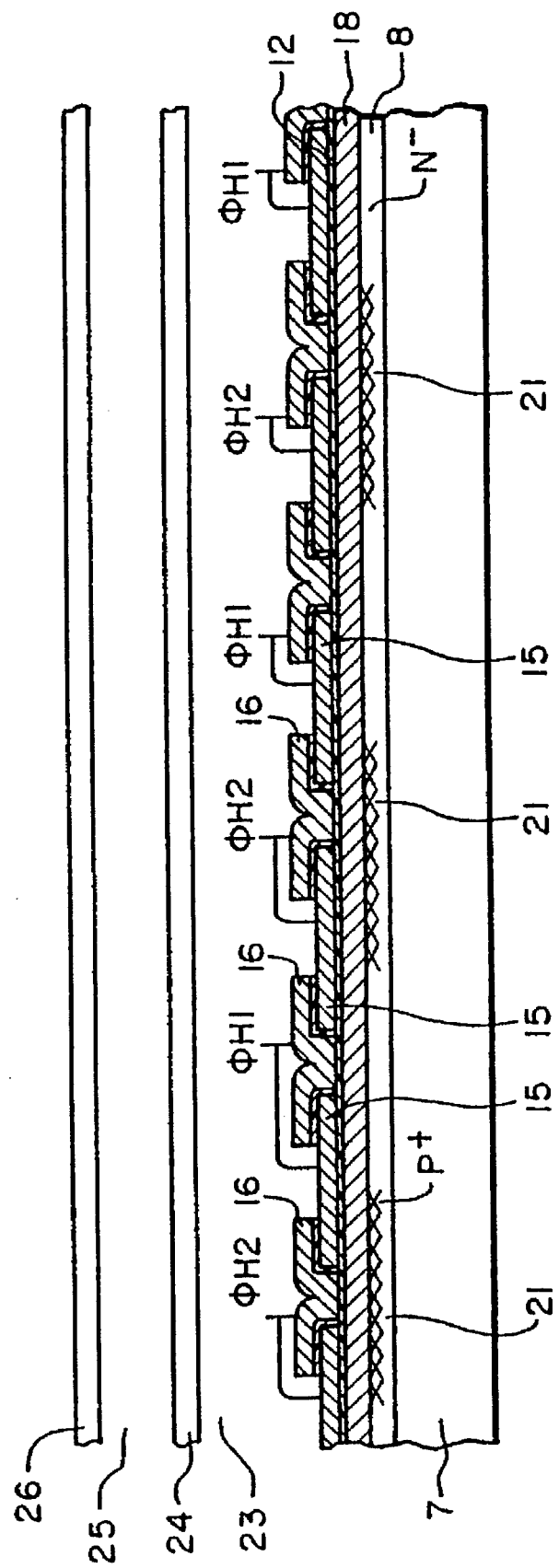
FIG. 3 is a cross-sectional view taken along section line X10—X10 in FIG. 1.
Figure 4:
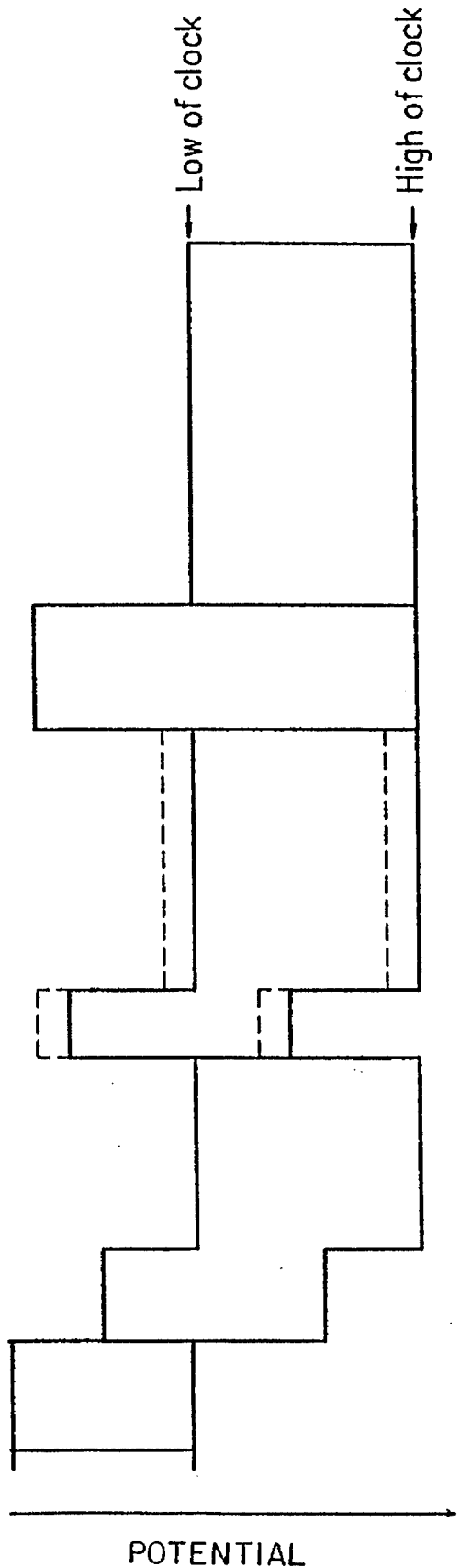
FIG. 4 is a diagram showing voltage potentials of vertical transfer channels, a transfer gate, horizontal transfer channels, a transfer gate and horizontal transfer channels in a CCD according to a conventional technique.
Figure 5:
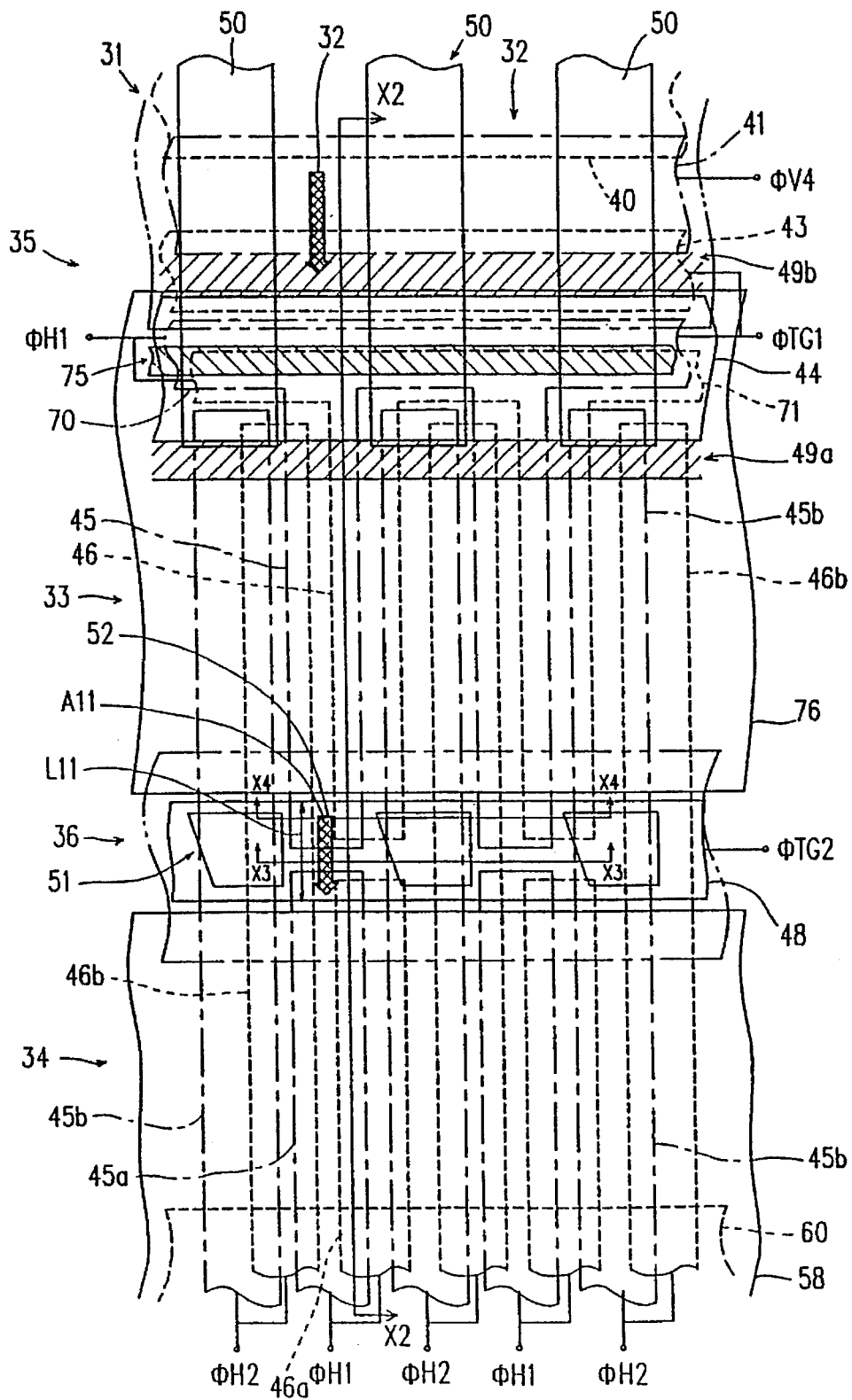
FIG. 5 is a plan view showing a boundary area between a plurality of vertical transfer channels and horizontal transfer channels according to an example of the present invention.

FIG. 5 is a plan view showing a boundary area between vertical transfer channels 32 and horizontal transfer channels 33 and 34 of the CTD 31 according to the present invention. The CTD 31 of the present example includes the vertical transfer channels 32 in a plurality of columns and the horizontal transfer channels 33 and 34 in two rows. Each of the vertical transfer channels 32 is constituted by a four-phase CCD using a final stage driving signal ΦV4. The CTD 31 has a first transfer gate 35 driven by a driving signal ΦTG1 between each vertical transfer channel 32 and the first horizontal transfer channel 33, and a second transfer gate 36 driven by a driving signal ΦTG2 between the horizontal transfer channels 33 and 34.

Figure 6:
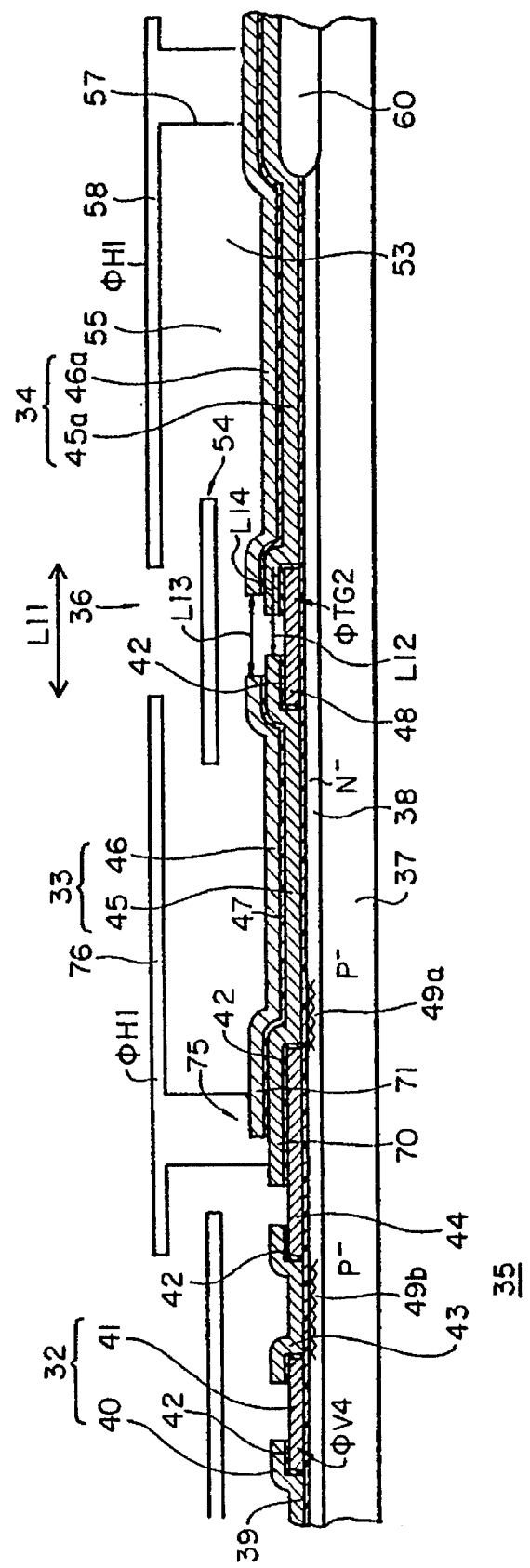
FIG. 6 is a cross-sectional view taken along section line X2—X2 in FIG. 5.
Figure 7:
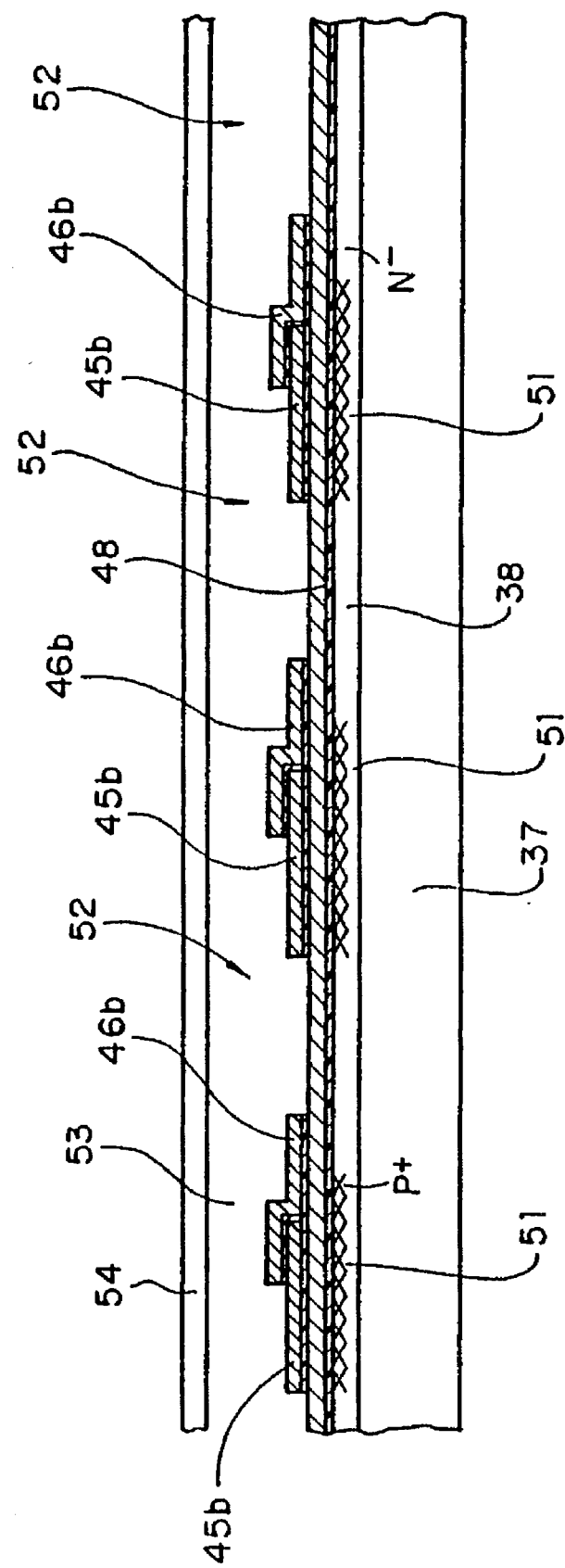
FIG. 7 is a cross-sectional view taken along section line X3—X3 in FIG. 5.
Figure 8:
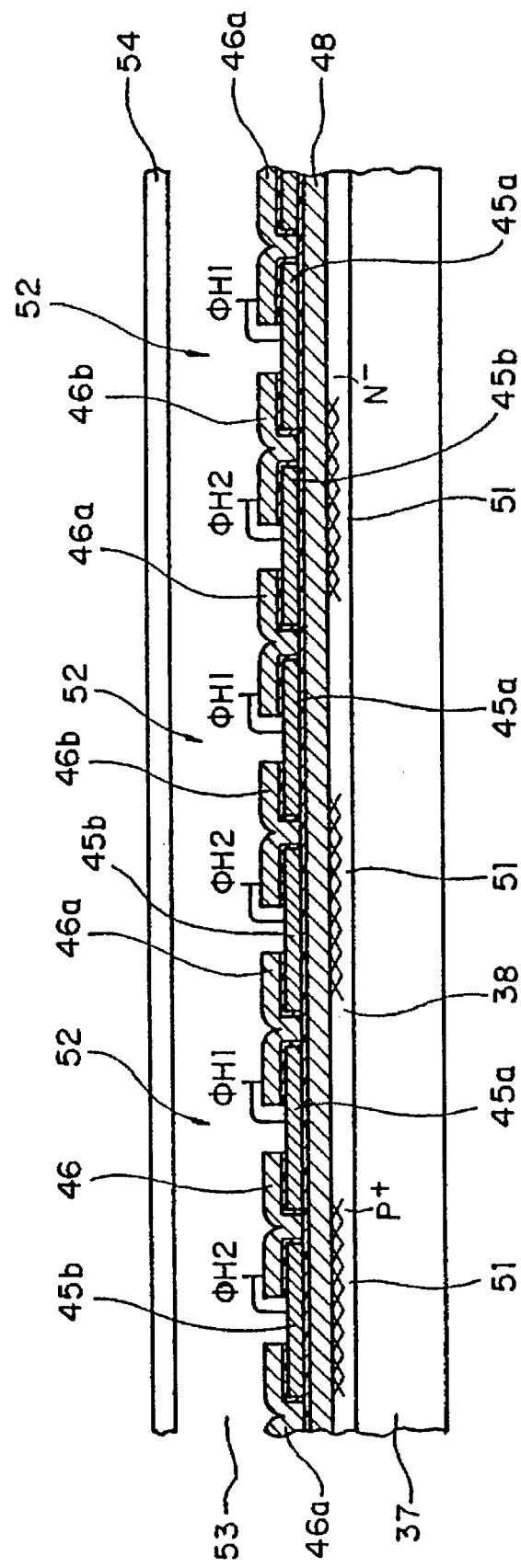
FIG. 8 is a cross-sectional view taken along section line X4—X4 in FIG. 5.

FIG. 6 shows a cross-sectional view taken along line X2—X2 in FIG. 5, FIG. 7 shows a cross-sectional view taken along line X3—X3 in FIG. 5, and FIG. 8 shows a cross-sectional view taken along line X4—X4 in FIG. 5. In the CTD 31, an N⁻ layer 38 is formed on a P-type substrate (hereinafter, referred to simply as a "substrate") 37, and then an insulating film 39 made of, for example, silicon oxide is formed on the N⁻ layer 38. The following configuration is formed on the insulating layer 39 by thin film technology. A P⁻ region is formed as a barrier region 49a in the N⁻ layer 38 between the transfer gate 35 and the horizontal transfer channel 33. A P⁻ region is formed as a barrier region 49b in the N⁻ layer 38 between an electrode 44 and an electrode 41 of the driving signal ΦV4 constituting the transfer gate 35. Each channel stop 50 having similar configuration to that of the barrier regions 49a and 49b is formed on each region between vertical transfer channels 32.

Each vertical transfer channel 32 of the CTD 31 includes electrodes 40 and 41 extending in a horizontal direction, i.e., a row direction. The electrodes 40 and 41 are formed in a plurality of columns, respectively, on the insulating layer 39 so that the ends of the width direction overlap each other. An insulating layer 42 is formed between the electrodes 40 and 41. An electrode 43 of the transfer gate 35 is formed so as to overlap the end areas of the width direction of the electrodes 41 on the final stage of the vertical transfer channels 32. The electrodes 43 and 44 extending in the row direction constitute the transfer gate 35. The other end area of the width direction of the electrode 43 overlaps part of electrode 44. The electrodes 43 and 44 are insulated from each other by an insulating layer 42. A driving signal ΦTG1 is supplied to the electrodes 43 and 44.

Each of the plurality of electrodes 45, 46, 45b and 46b constituting the first horizontal transfer channel 33 is formed so as to extend in the column direction and be arranged along the row direction. The electrodes 45, 46, 45b and 46b are formed in the vicinity of the end of the electrode 44 extending in the row electrode 43. The ends of the plurality of electrodes 45 on the side opposite to the transfer gate 35 extend to reach above an electrode 48 of the transfer gate 36. Each electrode 45 is integrally formed with a connecting portion 70 of band-like shape extending in the row direction on the electrode 44 of the transfer gate 35. A plurality of electrodes 45b of band-like shape are formed between the plurality of electrodes 45. The electrodes 45b extend along the column direction across the first horizontal transfer channel 33, the transfer gate 36, and the second transfer channel 34 and are arranged along the row direction.

A connecting portion 71 which partially overlaps the connecting portion 70 of the column direction and a plurality of electrodes 46 whose end areas of the width direction partially overlap the electrodes 45 and 45b, are formed. The plurality of electrodes 46 are formed in such a way that the end areas of the electrodes 46 on the side opposite to the transfer gate 35 extend to reach above the electrode 48 of the transfer gate 36. The plurality of electrodes 46 are integrally formed with the connecting portion 71. Each of the connecting portions 70 and 71 overlaps the vicinity of the end of the electrode 44 on the side opposite to the electrode 43. A plurality of electrodes 46b of band-like shape are formed between the plurality of electrodes 46. The electrodes 46b extend along the column direction across the first horizontal transfer channel 33, the transfer gate 36, and the second transfer channel 34, and are arranged along the row direction. Each of the electrodes 45b and 46b is formed, as shown in FIG. 7, so that the end areas in the width direction partially overlap each other.

The electrodes 45, 46, 45b and 46b included in the horizontal transfer channel 33 extend in the column direction perpendicular to the row direction. The end areas of the width direction of the plurality of electrodes 45 and 46 overlap each other. The driving signal ΦH1 is supplied to the electrodes 45 and 46. Each of the electrodes 45 is insulated from the electrode 44 by the insulating layer 42 as well as from each electrode 46 by the insulating layer 47. The electrodes 45 and 46 are formed, as shown in FIG. 5, in straight lines along the column direction in the region where the transfer gate 36 is formed.

The transfer gate 36, which extends in the row direction, includes an electrode 48 having a length of the column direction, i.e., a gate length L11. Channel stops 51 of the transfer gate 36 having similar configurations to those of the channel stops 50 are disposed in the N⁻ layer 38 under the electrode 48. With the placement of the channel stops 51, each transfer channel 52 extending in the direction indicated with an arrow All along the column direction is formed between the channel stops 51 in the transfer gate 36. A driving signal ΦTG2 is supplied to the electrode 48.

As shown in FIG. 6, the plurality of electrodes 45a and 46a extending in the column direction, which have the same widths as those of the electrodes 45 and 46 are formed on the prolongations of the electrodes 45 and 46, respectively. The plurality of electrodes 45a and 46a have the end portions opposing to the end portions of the plurality of electrodes 45 and 46 on the electrode 48, interposing distances L12 and L13 therebetween, respectively. Each of the electrodes 45a, 46a, 45b and 46b is included in the second horizontal transfer channel 34. In addition, the electrodes 45a, 46a, 45b and 46b are arranged and overlapped in the same way as in the first horizontal transfer channel 33. The electrodes 45b and 46b extend on the electrode 48 so as to cross the electrode 48 interposing the insulating layer 42 therebetween.

The substrate 37, on which the above configuration is formed, is coated with a transparent insulating film 53 as shown in FIGS. 6 to 8. Then, a light shielding layer 54 is formed on the transparent insulating film 53. Sequentially, a transparent insulating film 55 is formed on the light shielding film 54, and metal wirings 58 and 76 are formed on the transparent insulating film 55. The light shielding film 54 is formed of, for example, aluminum. A field oxide film 60 is formed on the substrate 37 under each of the end areas of the electrodes 45a and 46a opposite to the transfer gate 36. The metal wiring 58 made of aluminum or the like is connected to the electrodes 45a and 46a through a contact hole 57 formed through the insulating layers 53 and 55 on the field oxide film 60. A driving signal ΦH1' is supplied to the electrodes 45a and 46a through the metal wiring 58. The metal wiring 58 is formed, as shown in FIG. 5, so as to cover the horizontal transfer channel 34 from the side end area of the horizontal transfer channel 34 of the transfer gate 36.

Moreover, a metal wiring 76 made of, for example, aluminum is connected to the electrodes 45 and 46 through a contact hole 75 formed through the transparent insulating films 53 and 55 on the electrodes 44 of the transfer gate 35. The driving signal ΦH1 is supplied to the electrodes 45 and 46 through the metal wiring 76. The metal wiring 76 extends from the vicinity of the electrode 43 of the transfer gate 35 to the vicinity of the side end of the horizontal transfer channel 33 of the transfer gate 36 so as to cover the horizontal transfer channel 33, as shown in FIG. 5.

As described above, among the electrodes 45, 46, 45b and 46b of the horizontal transfer channel 33, the electrodes 45 and 46 adjacent to the transfer channel of the transfer gate 35 are electrically connected to the metal wiring 76 on the electrode 44 of the transfer gate 35. As for the electrodes 45a, 46a, 45b and 46b of the horizontal transfer channel 34, the electrodes 45a and 46a are electrically connected to the metal wiring 58 on the field insulating film 60 opposite to the transfer gate 36 with respect to the horizontal transfer channel 34. With this configuration, it is possible to independently form the electrodes 45 and 46, and the electrodes 45a and 46a which are electrically insulated from each other in the horizontal transfer channels 33 and 34. Moreover, the driving signals ΦH1 and ΦH1' can be independently supplied to the electrodes 45 and 46, and the electrodes 45a and 46a, respectively. The electrodes 45b and 46b opposed to the electrodes 45 and 46, and 45a and 46a, respectively, are common to the horizontal transfer channels 33 and 34.

Thus, it is possible to set the gate length L11 of the transfer gate 36 at a small value. It is also possible to provide the transfer channels 52 under the transfer gate 36 in such a way that each transfer channel 52 is perpendicular to the row direction in which the horizontal transfer channels 33 and 34 transfer charge. Moreover, each of the transfer channels 52 can be provided on each prolongation of the vertical transfer channel 32. With the above configuration, the bend of the transfer channels 52 in the transfer gate 36, as in a conventional CCD, is not required. As a result, the charge is perfectly transferred from the horizontal transfer channel 33 to the horizontal transfer channel 34, whereby no signal charge is left in the horizontal transfer channel 33.

The electrodes 45 and 46 are electrically connected to the metal wiring 76 on the transfer channel of the transfer gate 35. In this case, the electrodes 45 and 46 of second and third layers are electrically connected to the metal wiring 76 above the electrode 44 of a first layer serving as a barrier layer. Therefore, even if an alloy reaction is caused in the portion where the electrodes 45 and 46 are electrically connected to the metal wiring 76, the potential of transfer channel of the transfer gate 35 does not shift.

Light is likely to be incident on the transfer channels of the transfer gates 35 and 36 through a gap between the metal wirings 76 and 58 formed as shown in FIGS. 6 to 8. A light shielding film 54 of the first layer is formed in such a shape that the gap between the transfer gates 35 and 36 is covered, thereby preventing the light from being incident on the transfer channels. The light shielding film 54 is the same as one serving to reduce smear in a light receiving portion. Accordingly, it is possible to fabricate the CTD 31 having the configuration of the present example by the fabrication process of a conventional CTD without any modification, thereby avoiding further complication of the fabrication process. Moreover, with the configuration using the metal wirings 76 and 58, the horizontal transfer channels 33 and 34 can be completely shielded from the light.

Moreover, the contact hole 75, which is a connecting portion for electrically connecting the electrodes 45 and 46 to the metal wiring 76, is formed along the electrodes 43 and 44 of the transfer gate 35. Thus, the fabricating method which attains accuracy required for forming the contact hole 75 does not rely on the arrangement pitch, i.e., fabrication accuracy, of the electrodes 45, 46, 45b and 46b of the horizontal transfer channel 33 in the row direction. Therefore, even in the case where the arrangement pitch of the row direction of the electrodes 45, 46, 45b and 46b is reduced for miniaturizing and providing high density for the configuration of the image sensor using the CTD 31 of the present example, it is unnecessary to reconsider a design rule for fabrication accuracy of the contact hole 75. As a result, it is possible to provide each transfer channel 52 under the transfer gate 36 on each prolongation of the vertical transfer channel 32, even in the case where the arrangement pitch of the electrodes 45, 46, 45a, 46a, 45b and 46b of the horizontal transfer channels 33 and 34 is set at a small value such as 10 μm or less.

It is possible to implant ions to the extent of a central portion of a charge detecting portion in the horizontal direction in the CTD 31, using the gate electrodes 44 and 48 of the first layer as a mask in the vertical direction. The ion implantation should be carried out so that the channel potential of the first horizontal transfer channel 33 becomes lower than that of the second horizontal transfer channel 34 at the same gate voltage. Even in this case, the characteristic difference between the two output sections is not caused since the potential of a charge resetting section of the first horizontal transfer channel 33 can be set at the same value as that of the charge resetting section of the second horizontal transfer channel 34.

Figure 9:
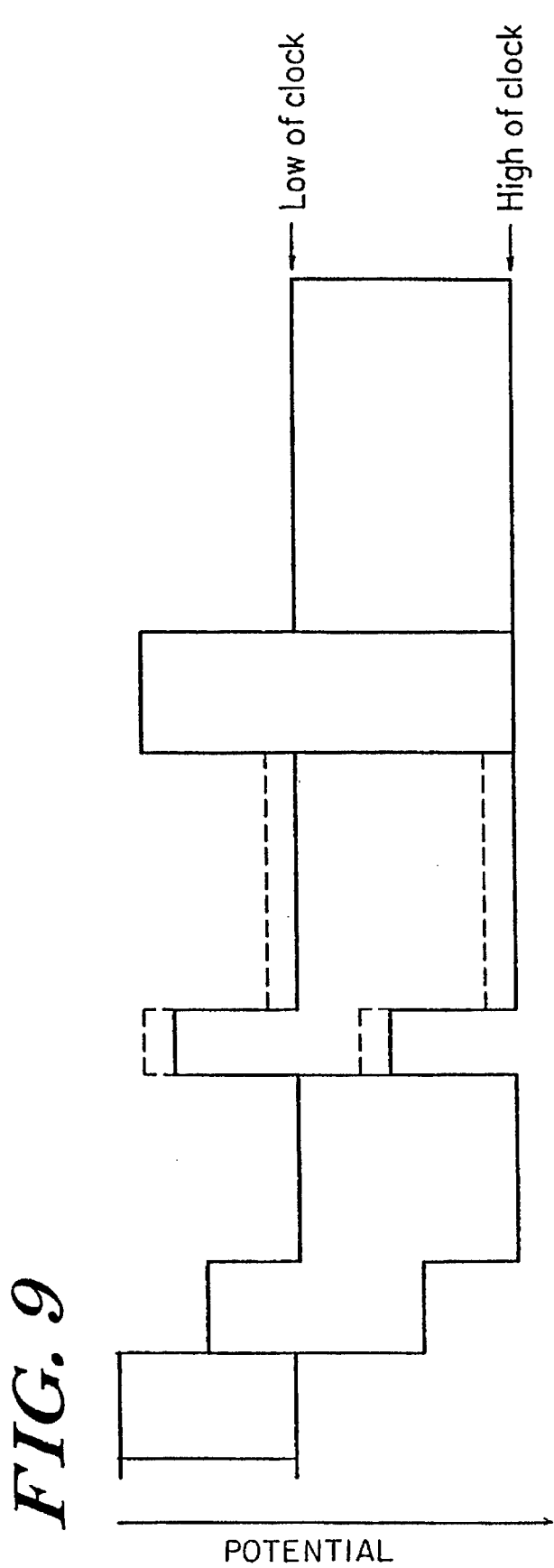
FIG. 9 is a diagram showing voltage potentials of vertical transfer channels 32, a transfer gate 35, a horizontal transfer channel 33, a transfer gate 36 and a horizontal transfer channel 34 in a CCD according to the present example.
Figure 10:
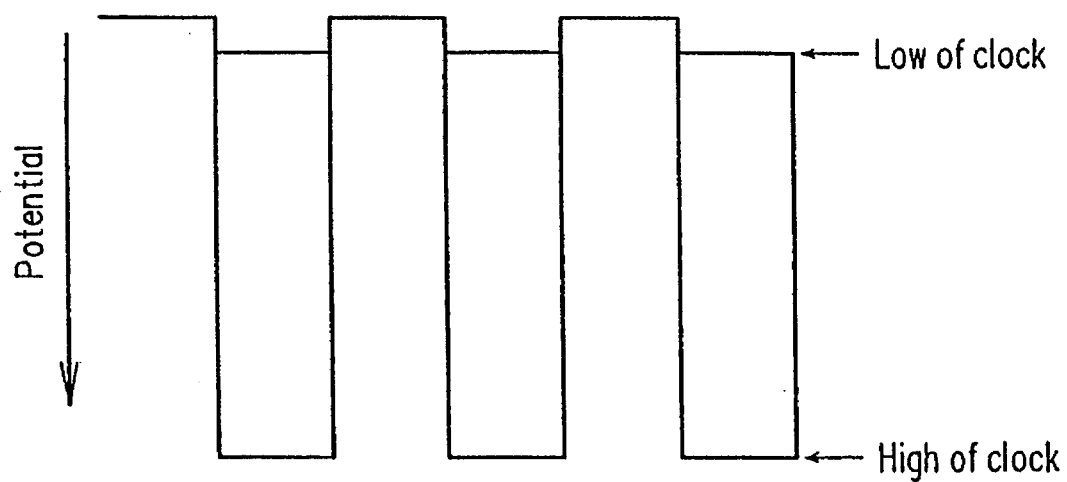
FIG. 10 is a diagram showing voltage potentials along a row direction in the transfer gate 36.

FIG. 9 shows voltage potentials of the vertical transfer channels 32, the transfer gate 35, the horizontal transfer channel 33, the transfer gate 36, and the horizontal transfer channel 34 of the CTD 31 according to the present example. FIG. 10 shows voltage potentials along the row direction in the transfer gate 36, and FIG. 11 shows a timing diagram illustrating a driving timing of the CTD 31 according to the present example. Next, charge transfer operations from the vertical transfer channel 32 to the horizontal transfer channels 33 and 34 and from the first horizontal transfer channel 33 to the second horizontal transfer channel 34 will be described, with reference to FIGS. 9 to 11.

At a time t1 of FIG. 11, after transferring the signal charge to an output section (not shown) at high speed, the horizontal transfer channels 33 and 34 are in a waiting state for input of the charge which is to be sequentially transferred from the vertical transfer channel 32. At this time, the signal charge previously read from the vertical transfer channel 32 is stored in the transfer gate 35 in advance.

The signal charge under the transfer gate 35 is transferred under the electrodes 45 and 46 of the first horizontal transfer channel 33 during a time period from t1 to t2, and then transferred under the electrodes 45a and 46a through the transfer gate 36 during a time period from t2 to t3. Thereafter, the signal charge under the electrodes 45a and 46a is waiting for the start of horizontal transfer while being held under the electrodes 45a and 46a. After the signal charge is transferred, the transfer gate 36 waits at a low-level until the signal charge is sequentially read from the vertical transfer channel 32.

The signal charge, which is waiting for the next transfer in the vertical transfer channel 32, is transferred to the transfer gate 35. Then, the thus transferred signal charge is further transferred under the electrodes 45 and 46 at a time t6. Thereafter, during a time period from t6 to t7, the signal charge is transferred under the electrodes 43 and 44 of the transfer gate 35 in order to prepare for the transfer of the next reading time period, and then stored therein. During the time period from t6 to t7, the other horizontal transfer electrodes 45b and 46b serve only as barriers for separating the charge stored in the horizontal transfer channels 33 and 34 along the horizontal direction, and are therefore maintained at a low-level at all times.

After the time t7, the signal charge stored in the first and second horizontal transfer channels 33 and 34 drive the driving signals ΦH1 and ΦH1' at the same phase, and the driving signals ΦH1, ΦH1' and ΦH2 are clocked by a two-phase driving method. With this operation, the signal charge is transferred in the horizontal direction at high speed, and then converted into a voltage of the level corresponding to the amount of charge in the signal output section (not shown).

In the present example, as described above, the electrodes 45 and 46 are electrically connected to the metal wiring 76 on the activated region other than the P⁻ region in the N⁻ layer 38. The changes in the channel potential due to an alloy reaction, as caused by a conventional method, can be prevented. This is because the contact hole 75, which serves as a connecting portion for electrically connecting the electrodes 45 and 46 to the metal wiring 76, is formed on the gate electrode 44 of the first layer which serves as a barrier layer. Moreover, the contact hole 75, through which the electrical connection is made, is formed in the shape and at the position corresponding to the gate electrode 44 of the first layer. Therefore, it is unnecessary to reconsider a design rule for accuracy of the technique for forming the contact hole 75 and to adopt another design rule suitable for minute processing even if the arrangement pitch of he horizontal direction of the electrodes 45, 46, 45a, 46a, 45b and 46b of the horizontal transfer channels 33 and 34 is reduced for miniaturizing and providing high density for the image sensor using the CTD 31 of the present invention.

In addition, the gate length L11 of the transfer gate 36 can be set at a sufficiently small value. Moreover, since the transfer channels 52 under the transfer gate 36 can be provided on the prolongations of the vertical transfer channels 32 so as to be parallel to the vertical transfer channel 32, it is not required to bend the transfer direction of the signal charge transferred from the transfer channels 52.

With the above configuration, the signal charge is not left when the signal charge is transferred from the vertical transfer channels 32 to the plurality of horizontal transfer channels 33 and 34. Therefore, pattern noise caused by any left over signal charge, especially in an image sensor, can be avoided.

As for the fabrication method of the CTD 31 according to the present example, it is the same as that of the conventional CTD since a barrier layer for preventing an alloy reaction is unnecessary. Regarding the driving method, the driving method of the present invention is an easy one, since to drive the CTD 31 only a signal line is added as compared with the structure of the conventional CTD.

The comparison between a conventional CTD disclosed in Japanese Laid-Open Patent Publication No. 4-213282 and the CTD of the present invention will be made.

The conventional example and the present invention are common in the following points. A plurality of horizontal transfer channels are provided. Moreover, each electrode of the horizontal transfer channel between the plurality of horizontal CCDs is formed as an independent electrode. Transfer channels are provided on the prolongations of the vertical CCDs so as to have the shortest distance with respect to the horizontal CCDs. However, the present example differs from the conventional example in the following point. In the conventional example, both electrodes (to which the driving signals ΦH1 and ΦH2 are applied) are formed as independent electrodes. On the other hand, in the present example, only one electrode (the driving signal ΦH1) is formed as an independent electrode. The electrode (the driving signal ΦH2) of the present invention is not an independent electrode. That is, since an independent terminal is not required and the electrodes have the same pulse, the configuration of the present invention is more useful for driving the CTD than that of the conventional example. The CTD of the present invention has such a configuration that the effects on output waveforms due to the rounding of waveforms between the electrodes can be inhibited. More specifically, the configuration of the present invention is such that the electrodes (the driving signals ΦH1 and ΦH2) for ten and several bits ahead of the output portion of the horizontal transfer channels are formed as independent terminals. The rounding of waveforms between the electrodes (the driving signals ΦH1 and ΦH2) is restrained while restraining the rounding of the driving waveform, and thus the roundings become similar to each other, thereby inhibiting the above effects.

As described above, according to the present invention, the gate electrodes and the metal wiring are in contact with each other in the activated region. However, since the first layer serves as a barrier layer on the gate electrode of the first layer, changes in the channel potential due to an alloy reaction can be prevented. Moreover, since the contact hole is provided in the shape corresponding to the gate electrode of the first layer, it is not required to reconsider a design rule even when the horizontal pitch is reduced for providing high density for the CTD. In addition, since the length of the transfer gate is set at a sufficiently small value and the transfer channels under the transfer gate are provided on the prolongations of the vertical transfer channels, it is unnecessary to bend the direction in which the charge is transferred.

With the above configuration, the signal charge is not left in the vertical transfer channels during the transfer of the signal charge from the vertical transfer channel to the plurality of horizontal transfer channels. Therefore, the pattern noise due to left over signal charge, especially caused in the image sensors, can be avoided.

Furthermore, the fabrication process of the CTD according to the present invention is the same as the conventional one, and only one signal line is added as compared with the structure of the conventional CTD. Thus, the driving method according to the present invention is an easy one to drive the CTD.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A charge transfer device comprising:

a plurality of vertical transfer channels;

a first transfer gate electrode placed at ends of the plurality of vertical transfer channels for receiving signal charge from the plurality of vertical transfer channels and for outputting the signal charge;

a plurality of horizontal transfer channels having a plurality of layers of gate electrodes for transferring the signal charge from the first transfer gate electrode in a horizontal direction;

at least one second transfer gate electrode disposed between the plurality of horizontal transfer channels for transferring the signal charge from one of the horizontal transfer channels to another horizontal transfer channel;

a conductive portion for supplying a transfer control signal to the plurality of horizontal transfer channels;

at least one output section for converting the signal charge transferred from the plurality of horizontal transfer channels into a voltage signal and for outputting the thus obtained voltage signal; and a contact portion provided on at least one of the first and second transfer gate electrodes, through which at least one of the plurality of layers of the gate electrodes in the horizontal transfer channels and the conductive portion are in contact with each other.

2. A charge transfer device according to claim 1, wherein a light shielding layer is provided so as to prevent light from being incident on at least one of the vertical transfer channels and the horizontal transfer channels.

3. A charge transfer device comprising:

a plurality of vertical transfer channels;

a transfer gate electrode placed at ends of the plurality of vertical transfer channels for receiving signal charge from the plurality of vertical transfer channels and for outputting the signal charge;

a plurality of horizontal transfer channels including two-phase charge-coupled devices having a first signal line and a second signal line and a plurality of layers of gate electrodes for transferring the signal charge from the transfer gate electrode in a horizontal direction; and a conductive portion for supplying a transfer control signal to the horizontal transfer channels;

wherein each of the gate electrodes, which is connected to one of the first and second signal lines adjacent to a transfer channel under the transfer gate electrode, is made independent for each transfer channel by electrically connecting the gate electrodes to the conductive portion on the transfer gate electrode, and wherein the residual gate electrodes connected to the other signal line are common to the plurality of horizontal transfer channels.

4. A charge transfer device according to claim 3, wherein the transfer channels under the transfer gate electrode are provided on prolongations of the vertical transfer channels so as to be perpendicular to the horizontal transfer channels.

5. A charge transfer device according to claim 4, wherein the transfer channel under the transfer gate electrode is provided on each prolongation of the vertical transfer channel.

6. A charge transfer device according to claim 3, wherein a potential of one of the horizontal transfer channels far from the vertical transfer channels is set so as to be higher than that of another horizontal transfer channel close to the vertical transfer channels in a case where a potential applied to each independent transfer electrode is identical when a signal charge is transferred to the plurality of horizontal transfer channels via the transfer gate.

7. A driving method for a charge transfer device comprising:

a plurality of vertical transfer channels;

a transfer gate electrode placed at ends of the plurality of vertical transfer channels for receiving signal charge from the plurality of vertical transfer channels and for outputting the signal charge;

a plurality of horizontal transfer channels including two-phase charge-coupled devices having a first signal line and a second signal line and a plurality of layers of gate electrodes for transferring the signal charge from the transfer gate electrode in a horizontal direction; and a conductive portion for supplying a transfer control signal to the horizontal transfer channels, wherein each of the gate electrodes which are connected to one of the first and second signal lines adjacent to a transfer channel under the transfer gate electrode is formed as an independent electrode for each transfer channel by electrically connecting the gate electrode to the conductive portion on the transfer gate electrode, and wherein the residual gate electrodes connected to the other signal line form a common electrode to the plurality of horizontal transfer channels, the driving method for the charge transfer device for applying a voltage to one signal line serving as the common electrode among the plurality of transfer channels so that a channel potential is kept to be low while charge is transferred from one horizontal transfer channel to another horizontal transfer channel through the transfer gate during a quiescent period of the horizontal transfer, wherein a clock is applied only to the other signal line which serves as the independent electrode for each of the plurality of horizontal transfer channels and a signal line of the transfer gate, thereby transferring a charge from one horizontal transfer channel to another horizontal transfer channel.

* * * * *